United States Patent
Sutoh et al.

(10) Patent No.: US 7,534,659 B2
(45) Date of Patent: May 19, 2009

(54) SILICONE-BASED ADHESIVE SHEET, METHOD OF BONDING A SEMICONDUCTOR CHIP TO A CHIP ATTACHMENT COMPONENT, AND A SEMICONDUCTOR DEVICE

(75) Inventors: Manabu Sutoh, Chiba Prefecture (JP); Yoshito Ushio, Chiba Prefecture (JP); Toyohiko Fujisawa, Chiba Prefecture (JP); Katsutoshi Mine, Chiba Prefecture (JP)

(73) Assignee: Dow Corning Toray Silicone Company, Ltd., Tokyo (JP)

( * ) Notice: Subject to any disclaimer, the term of this patent is extended or adjusted under 35 U.S.C. 154(b) by 341 days.

(21) Appl. No.: 10/521,287

(22) PCT Filed: Jul. 14, 2003

(86) PCT No.: PCT/JP03/08936

§ 371 (c)(1),
(2), (4) Date: Aug. 8, 2005

(87) PCT Pub. No.: WO2004/007628

PCT Pub. Date: Jan. 22, 2004

(65) Prior Publication Data
US 2006/0057779 A1    Mar. 16, 2006

(30) Foreign Application Priority Data
Jul. 15, 2002    (JP) .............................. 2002-205869

(51) Int. Cl.
*H01L 21/00* (2006.01)
*C08G 77/12* (2006.01)
*C08G 77/20* (2006.01)
*C08G 77/04* (2006.01)

(52) U.S. Cl. ............... 438/118; 438/113; 438/109; 438/106; 528/31; 528/32; 528/33

(58) Field of Classification Search ............... 438/118; 528/15, 31; 427/208; 428/317.5, 343; 156/249
See application file for complete search history.

(56) References Cited

U.S. PATENT DOCUMENTS 3,284,406 A * 11/1966 Nelson .................. 528/31

(Continued)

FOREIGN PATENT DOCUMENTS

EP        571649 A1 *  12/1993

(Continued)

OTHER PUBLICATIONS

English language Abstract for JP 10-017828 extracted from espacenet.com database dated Apr. 19, 2005.

(Continued)

*Primary Examiner*—Randy Gulakowski
*Assistant Examiner*—Robert Loewe
(74) *Attorney, Agent, or Firm*—Howard & Howard Attorneys PLLC

(57) ABSTRACT

A silicone-based adhesive sheet has either a layer of clay-like curable silicone composition on one side and a layer of slower curing clay-like curable silicone composition than the first composition layer on the other side, or a cured silicone layer on one side and a layer of clay-like curable silicone composition on the other side. The silicone-based adhesive sheet may be used in a method for bonding semiconductor chip and a chip attachment component. A semiconductor device may be prepared by the method.

23 Claims, 3 Drawing Sheets

U.S. PATENT DOCUMENTS

| | | | |
|---|---|---|---|
| 3,436,366 A * | 4/1969 | Modic | 524/862 |
| 3,457,214 A * | 7/1969 | Modic | 524/863 |
| 3,639,155 A * | 2/1972 | Hartlein et al. | 428/447 |
| 3,989,790 A * | 11/1976 | Bruner et al. | 264/225 |
| 4,163,082 A * | 7/1979 | Romenesko | 428/447 |
| 4,297,265 A * | 10/1981 | Olsen | 524/493 |
| 4,358,558 A * | 11/1982 | Shimizu | 524/379 |
| 4,500,584 A * | 2/1985 | Modic | 428/145 |
| 4,889,576 A * | 12/1989 | Suganuma et al. | 156/249 |
| 4,940,112 A * | 7/1990 | O'Neill | 181/290 |
| 5,294,487 A * | 3/1994 | Ohashi et al. | 428/308.4 |
| 5,324,542 A * | 6/1994 | Modic | 427/387 |
| 5,357,007 A * | 10/1994 | Wengrovius et al. | 525/478 |
| 5,449,560 A * | 9/1995 | Antheunis et al. | 428/447 |
| 5,476,565 A * | 12/1995 | Akada et al. | 156/235 |
| 5,503,927 A * | 4/1996 | Ragland et al. | 428/353 |
| 5,658,629 A * | 8/1997 | Delcuve et al. | 428/41.3 |
| 5,789,485 A * | 8/1998 | Kobayashi et al. | 525/100 |
| 5,932,060 A * | 8/1999 | O'Brien et al. | 156/329 |
| 5,942,565 A | 8/1999 | Okami et al. | |
| 5,993,590 A * | 11/1999 | Krotseng | 156/230 |
| 6,036,997 A * | 3/2000 | Ragland et al. | 427/208.4 |
| 6,235,862 B1 | 5/2001 | Isshiki et al. | |
| 6,304,000 B1 | 10/2001 | Isshiki et al. | |
| 6,319,754 B1 * | 11/2001 | Wang et al. | 438/113 |
| 6,379,792 B1 * | 4/2002 | Isshiki et al. | 428/355 R |
| 6,531,643 B2 * | 3/2003 | Suzuki | 604/381 |
| 6,716,533 B2 * | 4/2004 | Griswold et al. | 428/447 |
| 6,913,833 B2 * | 7/2005 | Ikeno et al. | 428/447 |
| 2003/0224183 A1 * | 12/2003 | Warburton-Pitt | 428/447 |
| 2004/0265599 A1 * | 12/2004 | Ushio et al. | 428/447 |

FOREIGN PATENT DOCUMENTS

| | | |
|---|---|---|
| EP | 0 614 959 | 9/1994 |
| EP | 1 041 117 | 10/2000 |
| JP | 10-017828 | 1/1998 |
| JP | 11-012546 | 1/1999 |
| JP | 200119933 * | 1/2001 |

OTHER PUBLICATIONS

English language Abstract for JP 11-012546 extracted from espacenet.com database dated Mar. 31, 2005.

* cited by examiner

SILICONE-BASED ADHESIVE SHEET, METHOD OF BONDING A SEMICONDUCTOR CHIP TO A CHIP ATTACHMENT COMPONENT, AND A SEMICONDUCTOR DEVICE

TECHNICAL FIELD

This invention relates to a silicone-based adhesive sheet, a method of bonding a semiconductor chip to a chip attachment component, and a semiconductor device. More particularly, this invention relates to a silicone-based adhesive sheet whereby a smooth base and a base having irregularities in the surface can be bonded in a satisfactory manner, and wherein the thickness of the bonded layer can be made nearly uniform. This invention further relates to a method of bonding a semiconductor chip to a chip attachment component wherein the semiconductor chip and the chip attachment component can be satisfactorily bonded together even if at least one of the two has irregularities in the surface. This invention further relates to a semiconductor device with superior reliability, wherein the semiconductor chip and the chip attachment component can be satisfactorily bonded together even if at least one of the two has irregularities in the surface.

BACKGROUND ART

It is proposed in Japanese Patent Application Laid-open No. 11-12546 (corresponding U.S. Pat. No. 6,235,862) that a silicone-based adhesive sheet obtained by curing a hydrosilylation-curable silicone composition sandwiched between two protective films can be used for bonding a semiconductor chip and a chip attachment component. However, such sheets have had problems in that when irregularities of 10 μm or greater (gaps) occur in the surface of the semiconductor chip and/or the chip attachment component, the ability to fill the gaps decreases and the two cannot be sufficiently bonded.

A clay-like sheet adhesive having a thickness of 0.1 to 5 millimeters (mm) and comprising an organopolysiloxane, a filler, and a silicone composition containing an adhesion promoter is proposed in Japanese Patent Application Laid-open No. 10-17828 (corresponding U.S. Pat. No. 5,942,565). However, bonding a base and another base using such a sheet adhesive has had problems in that the thickness of the bonded layer is nonuniform. Particularly when a semiconductor chip is bonded to a chip attachment component by means of such a sheet adhesive, problems have arisen in that the thickness of the bonded layer becomes nonuniform, causing inconveniences in subsequent wire bonding processes.

Therefore, an object of this invention is to provide a silicone-based adhesive sheet whereby a smooth base and a base having irregularities in the surface can be bonded in a satisfactory manner, and wherein the thickness of the bonded layer can be made nearly uniform; to provide a method of bonding a semiconductor chip to a chip attachment component wherein the semiconductor chip and the chip attachment component can be satisfactorily bonded together even if at least one of the two has irregularities in the surface; and to provide a semiconductor device with superior reliability, wherein the semiconductor chip and the chip attachment component can be satisfactorily bonded together even if at least one of the two has irregularities in the surface.

DISCLOSURE OF INVENTION

The silicone-based adhesive sheet of this invention has a layer of clay-like curable silicone composition on one side of the sheet and has a layer of a slower curing clay-like silicone composition than the first-mentioned layer on the other side of the sheet, or has a cured silicone layer on one side and has a layer of clay-like curable silicone composition on the other side.

The method of bonding a semiconductor chip to a chip attachment component of the present invention comprises the steps of (1) producing a semiconductor chip by dicing a laminated body composed of a cured silicone layer bonded to a wafer, a layer of clay-like curable silicone composition firmly bonded to the cured layer, a protective film firmly bonded to the composition layer, and a sheet adhesively attached to film; (2) peeling the protective film and the sheet from the chip; (3) bonding the semiconductor chip to the chip attachment component by pressing the semiconductor chip to the chip attachment component via the composition layer; and (4) curing the composition layer.

The semiconductor device of this invention comprises a silicone-based adhesive sheet having a layer of clay-like curable silicone composition (I) on one side and having a layer of a slower curing clay-like curable silicone composition (II) than the layer of composition (I) on the other side, whereby (i) the layer of composition (I) is cured so that the layer of composition (II) remains uncured while the layer of composition (I) is kept in contact with a semiconductor chip, and the layer of composition (II) is subsequently cured while kept in contact with a semiconductor chip attachment component, or whereby (ii) the layer of composition (I) is cured so that the layer of composition (II) remains uncured while the layer of composition (I) is kept in contact with the semiconductor chip attachment component, and the layer of composition (II) is subsequently cured while kept in contact with the semiconductor chip.

Alternatively, the semiconductor device of this invention comprises a silicone-based adhesive sheet having a cured silicone layer on one side and having a layer of clay-like curable silicone composition on the other side, whereby (i) the cured layer is bonded so that the composition layer remains uncured while the cured layer is kept in contact with a semiconductor chip, and the composition layer is subsequently cured while kept in contact with a semiconductor chip attachment component, or whereby (ii) the cured layer is bonded so that the composition layer remains uncured while the cured layer is kept in contact with the semiconductor chip attachment component, and the composition layer is subsequently cured while kept in contact with the semiconductor chip.

Figure 1:
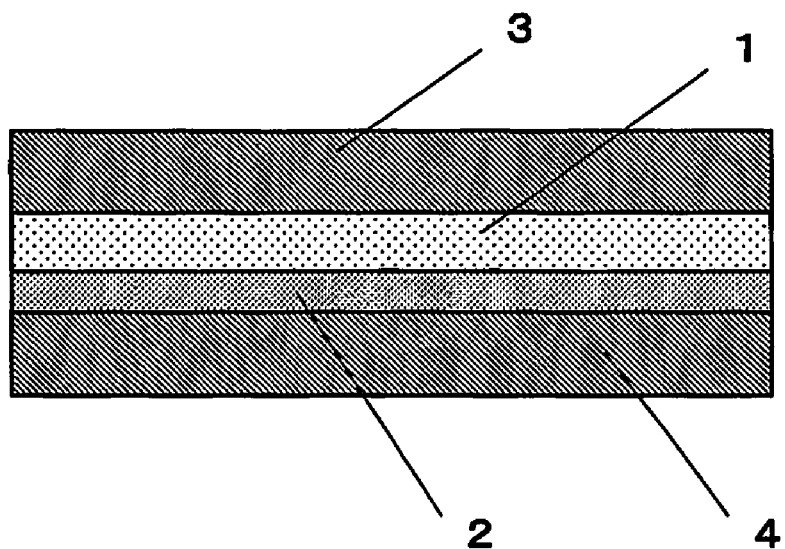
FIG. 1 is a cross-sectional view of the silicone-based adhesive sheet of the present invention created in Example 2.

| Reference Numerals | |
|---|---|
| 1: | layer of clay-like curable silicone composition |
| 2: | layer of clay-like curable silicone composition |
| 3: | protective film |
| 4: | protective film |
| 5: | silicone cured layer |
| 6: | layer of clay-like curable silicone composition |
| 7: | protective film |
| 8: | protective film |
| 9: | wafer |
| 10: | silicone cured layer |
| 11: | layer of clay-like curable silicone composition |
| 12: | protective film |
| 13: | adhesive sheet |
| 14: | semiconductor chip |
| 15: | silicone cured layer |
| 16: | silicone cured layer |
| 17: | semiconductor chip attachment component |
| 18: | bonding wire |
| 19: | silicone rubber based adhesion layer |

DETAILED DESCRIPTION OF THE PREFERRED EMBODIMENTS

Silicone-Based Adhesive Sheet

The silicone-based adhesive sheet of the present invention is shown in FIG. 1. The sheet has a layer of clay-like curable silicone composition 1 on one side, and has a layer of a slower curing clay-like silicone composition 2 than the first-mentioned layer on the other side. The curing speeds of these curable silicone compositions may, for example, be compared based on their 90% vulcanizing times $\{t_c(90)\}$ measured under the same temperature conditions (for example, 130° C., 150° C.) in vulcanizing tests performed using an oscillating vulcanizing tester, as specified by JIS K 6300. The difference in curing speeds is not limited, but the ratio of the $t_c(90)$ for the curable silicone composition with a low curing speed to the $t_c(90)$ for the curable silicone composition with a high curing speed is preferably 5 times or greater, and more preferably 10 times or greater, at 130° C., or is preferably 2 times or greater, and more preferably 5 times or greater, at 150° C.

The thickness of the composition layer 1 is not limited, but is preferably 100 micrometers (μm) or less, more preferably 1 to 100 μm, and even more preferably 1 to 50 μm. The thickness of the composition layer 2 is also not limited, but is preferably 100 μm or less, more preferably 1 to 100 μm, and even more preferably 1 to 50 μm. The thickness of the sheet is also not limited, but is preferably 100 μm or less.

The plasticity numbers of theses clay-like curable silicone compositions, as specified by JIS K 6249 are not limited, and may either be the same or different. The plasticity numbers are both preferably within a range of 100 to 800, and more preferably within a range of 100 to 700, and even more preferably within a range of 100 to 500. The plasticity numbers are the values when a load of 49±0.05N is applied for 3 minutes to a specimen {a cylindrical object (diameter: 16 mm, height: 10 mm) with a volume of 2±0.02 cm$^3$} by means of a parallel plate plastimeter (William's Plastimeter) according to the specifications in JIS K 6249.

The properties of a cured silicone substance obtained by curing these clay-like curable silicone compositions are not limited, and may either be the same or different. The cured silicone materials preferably have elastomer properties, and more preferably rubber properties. The mechanisms for curing these clay-like curable silicone compositions are not limited, and may either be the same or different. Examples of the curable silicone compositions include hydrosilylation-curable silicone compositions, condensation-curable silicone compositions, silicone compositions curable by radical reactions involving organic peroxides, and silicone compositions curable by high-energy radiation. In the silicone-based adhesive sheet of the present invention, the slower curing curable silicone composition and the faster curing curable silicone composition are both preferably hydrosilylation-curable silicone compositions.

These hydrosilylation-curable silicone compositions are preferably curable silicone compositions comprising (A) an organopolysiloxane having at least two alkenyl groups per molecule; (B) a filler; (C) an organopolysiloxane having at least two silicon-bonded hydrogen atoms per molecule; (D) an adhesion promoter; and (E) a hydrosilylation catalyst.

Component (A) is an organopolysiloxane having at least two alkenyl groups per molecule. The weight-average degree of polymerization of component (A) is preferably 3,000 or greater, and the properties thereof are preferably those of natural rubber. Examples of the molecular structure of component (A) include a straight chain structure, a partially branched straight chain structure, a branched chain structure, and a net structure. Examples of the alkenyl groups of component (A) include vinyl, allyl, butenyl, pentenyl, and hexenyl groups, with the vinyl group in particular being preferred. Examples of the bonding positions of these alkenyl groups include ends of molecular chains and/or side chains of molecular chains. Examples of the groups bonded to silicon atoms other than alkenyl groups include substituted or unsubstituted monovalent hydrocarbon groups such as methyl, ethyl, propyl, butyl, pentyl, hexyl, heptyl, and other such alkyl groups; phenyl, tolyl, xylyl, naphthyl, and other such aryl groups; benzyl, phenethyl, and other such aralkyl groups; chloromethyl, 3-chloropropyl, 3,3,3-trifluoropropyl, and other such alkyl halide groups, with methyl, phenyl, and the like in particular being preferred. When component (A) contains the phenyl group, the resulting sheet is endowed with superior low-temperature resistance, and the reliability of the semiconductor device obtained by bonding the semiconductor chip to the chip attachment component with the aid of this sheet can be improved.

Component (B) is a filler for reducing the fluidity of the above-mentioned composition and for imparting mechanical strength to the cured composition obtained by curing the above-mentioned composition. Component (B) is a filler that can commonly be admixed with a curable silicone composition as long as the objects of the present invention are not compromised, and examples include precipitated silica, fumed silica, baked silica, titanium oxide, alumina, glass, quartz, aluminosilicate, iron oxide, zinc oxide, calcium carbonate, carbon black, silicon carbide, silicon nitride, boron nitride, and other such inorganic fillers; inorganic fillers obtained by treating these fillers with organohalosilane, organoalkoxysilane, organosilazane, and other such organosilicon compounds; silicone resins, epoxy resins, fluororesins, and other such organic resin fine powders; fillers such as silver, copper, and other such electroconductive metallic powders; and silicone elastomer powders. Precipitated silica, fumed silica, and other types of reinforced silica, as well as colloidal calcium carbonate, carbon black, and other such thickening and reinforcing microparticulate fillers are particularly preferred.

In the above-mentioned composition, the content of component (B) is not limited, but is preferably within a range of 1 to 1,000 parts by weight, more preferably within a range of 5 to 800 parts by weight, even more preferably within a range of 5 to 500 parts by weight, particularly preferably within a range of 5 to 200 parts by weight, and ideally within a range of 5 to 100 parts by weight, per 100 parts by weight of component (A). Particularly, when using a microparticulate filler capable of endowing strength as component (II), the content is preferably within a range of 1 to 100 parts by weight, and more preferably within a range of 1 to 50 parts by weight, per 100 parts by weight of component (A). This is because the resulting cured product tends to fail to be endowed with sufficient mechanical strength when the content of component (B) is less than the lower limit of the above-mentioned ranges, and a uniform composition tends to be more difficult to prepare when the content exceeds the upper limit of the above-mentioned ranges.

Component (C) is a cross-linking agent of the above-mentioned composition, and is an organopolysiloxane having at least two silicon-bonded hydrogen atoms per molecule. Examples of the molecular structure of component (C) include a straight chain structure, a partially branched straight chain structure, a branched chain structure, a ring structure, and a net structure. Examples of the bonding positions of the hydrogen atoms bonded to the silicon atoms in component (C) include ends of molecular chains or side chains of molecular chains, or both. Examples of the groups bonded to silicon atoms other than the hydrogen atoms in component (C) include substituted or unsubstituted monovalent hydrocarbon groups identical to those previously described, and methyl groups and phenyl groups are particularly preferred. The viscosity of component (C) at 25° C. is not limited, but is preferably 1 to 100,000 millipascal-seconds (mPa·s), and more preferably 1 to 10,000 mPa·s.

In the composition, the content of component (C) is not limited as long as it is an amount sufficient to cure the composition, and the silicon-bonded hydrogen atoms in the composition are preferably within a range of 0.1 to 10 mol, more preferably within a range of 0.1 to 5 mol, even more preferably within a range of 0.5 to 5 mol, and ideally within a range of 1 to 5 mol, per mole of the alkenyl groups in component (A). This is because the resulting composition tends to be insufficiently cured when the content of component (C) is less than the lower limit of the above-mentioned ranges, and the heat resistance of the resulting cured product tends to decrease when the content exceeds the upper limit of the above-mentioned ranges.

Component (D) is an adhesion promoter for endowing the composition with satisfactory adhesion. Component (D) is preferably an organosilicon compound having at least one hydrolyzable group bonded to the silicon atoms per molecule, and is more preferably an organosilicon compound having at least two hydrolyzable groups bonded to the same silicon atom. This hydrolyzable group may be, for example, a methoxy, ethoxy, propoxy, butoxy, methoxy-ethoxy, or other such alkoxy group; an acetoxy or other such acyloxy group; an isopropenoxy or other such alkenoxy group; or a dimethyl ketoxime, methylethyl ketoxime, or other such oxime group, but the hydrolyzable group is preferably an alkoxy group, and more preferably a methoxy group. Component (D) is preferably an organosilicon compound having a trimethoxy group. In addition to substituted or unsubstituted monovalent hydrocarbon groups identical to those previously described, examples of groups bonded to the silicon atoms other than the hydrolyzable group in the organosilicon compound include 3-glycidoxypropyl, 4-glycidoxybutyl, and other such glycidoxy alkyl groups; 2-(3,4-epoxycyclohexyl)ethyl, 3-(3,4-epoxycyclohexyl)propyl, and other such epoxycyclohexyl alkyl groups; monovalent organic groups containing epoxy groups such as 4-oxyranyl butyl, 8-oxyranyl octyl, and other such oxyranyl alkyl groups; 3-methacryloxy propyl groups and other such monovalent organic groups containing acryl groups; and hydrogen atoms. Since satisfactory adhesion can be provided to various bases, the organosilicon compound preferably has at least one monovalent organic group containing an epoxy group per molecule. Examples of such organosilicon compounds include organosilanes, organosiloxanes, and silatranes. Examples of the molecular structure of such organosiloxanes include a straight chain structure, a partially branched straight chain structure, a branched chain structure, a ring structure, and a net structure, and a straight chain structure, a branched chain structure, or a net structure is particularly preferred.

Examples of the organosilicon compound in component (D) include 3-glycidoxypropyl trimethoxysilane, 2-(3,4-epoxycyclohexyl)ethyl trimethoxysilane, 3-methacryloxypropyl trimethoxysilane, and other such organosilanes; organosiloxanes having at least one of each of a silicon-bonded alkoxy group and a silicon-bonded alkenyl group or a silicon-bonded hydrogen atom per molecule, mixtures of organosilanes or organosiloxanes having at least one silicon-bonded alkoxy group and organosiloxanes having at least one of each of a silicon-bonded hydroxy group and a silicon-bonded alkenyl group per molecule, organosiloxanes shown by the average unit formula:

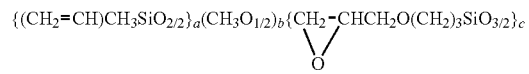

where a, b, and c are positive numbers, organosiloxanes shown by the average unit formula

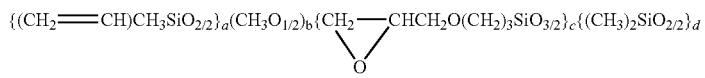

where a, b, c, and d are positive numbers, silatranes shown by the formula

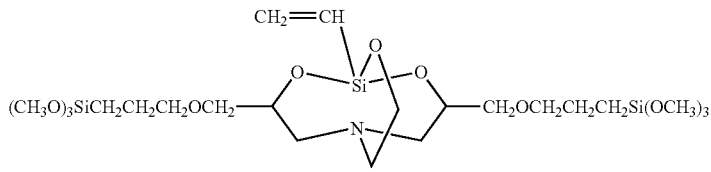

and silatranes shown by the formula

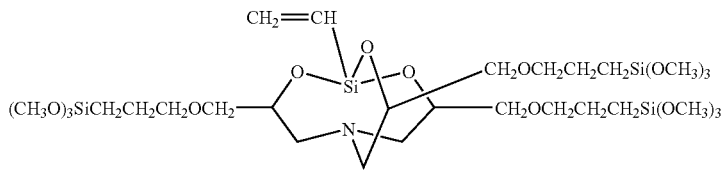

In the composition, the content of component D) is not limited as long as it is present in a sufficient amount capable of endowing the composition with satisfactory adhesiveness, but is preferably 0.01 to 20 parts by weight, and is more preferably 0.1 to 10 parts by weight, per 100 parts by weight of component (A). This is because the adhesiveness of the resulting composition tends to decrease when the content of component (D) is less than the lower limit of the above-mentioned ranges, and the mechanical characteristics of the resulting cured product tends to be adversely affected when the content exceeds the upper limit of the above-mentioned ranges, although the adhesiveness of the resulting composition remains unaffected.

Component (E) is a hydrosilylation catalyst for promoting curing reactions in the composition. Examples of component (E) include platinum catalysts, rhodium catalysts, and palladium catalysts, and a platinum catalyst is particularly preferred because it can significantly promote the curing reaction. Examples of this platinum catalyst include fine platinum powders, platinum black, platinum supported fine silica powders, platinum supported active carbon, chloroplatinic acid, alcohol solutions of chloroplatinic acid, platinum-olefin complexes, platinum alkenyl siloxane complexes, and resin powders wherein these platinum catalysts are dispersed or encapsulated in an acrylic resin, polycarbonate resin, silicone resin, polyamide resin, or other such thermoplastic resin.

In the composition, the content of component (E) is not limited as long it is an amount sufficient to promote the curing reaction of the above-mentioned composition; for example, when a platinum catalyst is used as component (E), the amount of platinum metal in the catalyst is preferably 0.01 to 1,000 ppm in units of weight in relation to the composition, and is more preferably 0.1 to 500 ppm. This is because the curing reaction of the resulting composition tends to be extremely slow when the content of component (E) is an amount less than the lower limit of the above-mentioned range, and the resulting cured product is in danger of becoming colored or undergoing other undesirable changes when the content exceeds the upper limit of the above-mentioned range, although the curing speed remains largely unaffected.

To adjust the curing speed, the above-mentioned composition preferably contains a curing inhibitor such as 3-methyl-1-butyn-3-ol, 3,5-dimethyl-1-hexyn-3-ol, phenyl butynol, or another such alkyne alcohol; 3-methyl-3-penten-1-yn, 3,5-dimethyl-3-hexen-1-yn, or another such en-yn compound; 1,3,5,7-tetramethyl-1,3,5,7-tetravinyl cyclotetrasiloxane, 1,3,5,7-tetramethyl-1,3,5,7-tetrahexenyl cyclotetrasiloxane, or another such organosiloxane containing an alkenyl group; an organosilane shown by the formula

an organosilane shown by the formula

an organosilane shown by the formula

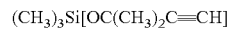

or another such organosilane containing an alkynoxy group; or benzotriazole.

In the composition, the content of the curing inhibitor is not limited, but is preferably 0.00001 to 5 parts by weight per 100 parts by weight of component (A). This is because the curing speed of the resulting composition is difficult to adjust and handling operations are impaired when the content of the curing inhibitor is less than the lower limit of the above-mentioned range, the resulting composition is in danger of being insufficiently cured when the content exceeds the upper limit of the above-mentioned range.

The composition may also contain dyes, pigments, agents for imparting heat resistance, flame retardants, and other additives that can commonly be admixed into curable silicone compositions as other optional components as long as the objects of the present invention are not compromised.

To adjust the curing speed of any hydrosilylation-curable silicone composition for manufacturing the above-mentioned sheet, it is possible, for example, to select the type of component (C), to select the type of component (E), to adjust the content thereof, to select the type of curing inhibitor, and to adjust the content thereof Specifically, when an organopolysiloxane having silicon-bonded hydrogen atoms at the ends of the molecular chain is used as component (C) in the composition, higher reactivity is achieved that is provided by an organopolysiloxane having silicon-bonded hydrogen atoms in the side chains of the molecular chain, and the resulting composition is therefore rapidly cured. Also in the composition, the resulting composition is cured more rapidly with a larger content of component (E). Also, the resulting composition is cured slower with a greater content of the curing inhibitor. Thus, clay-like curable silicone compositions with different curing speeds can be prepared. The curing speeds of these clay-like curable silicone compositions may, for example, be ascertained based on their 90% vulcanizing times $\{t_c(90)\}$ measured under the same temperature conditions (for example, 130° C., 150° C.) in vulcanizing tests conducted using an oscillating vulcanizing tester, as specified by JIS K 6300.

In FIG. 1, protective films 3 and 4 are firmly bonded to both surfaces of the sheet. The use of the protective films is optional, but the protective films are preferably firmly bonded to either side or both sides of the sheet because they prevent dust from depositing on the front surface of the sheet. The protective films are peeled off when the sheet is used. The protective films 3 and 4 may be the same or different. Examples of such protective films specifically include films comprising polyethylene terephthalate resins (PET), polypropylene resins (PP), polyether sulfone resins (PES), triacetate cellulose resins (TAC) and other such cellulose resins, as well as polyimide resins, polyester resins, polyether resins, epoxy resins, phenol resins, polyamide resins, and other such organic resins; and films wherein the surface of the film comprising these organic resins is covered with a fluorocarbon resin or another organic resin.

The method for preparing the sheet is not limited, and examples include a method wherein a solution of a clay-like curable silicone composition in toluene, heptane, or another such organic solvent is applied to a protective film, an organic solvent solution of a clay-like curable silicone composition with a curing speed different from that of the aforementioned composition is similarly applied to another film, and the clay-like curable silicone compositions are then laminated together; a method wherein an organic solvent solution of a clay-like curable silicone composition is applied to a protective film, and an organic solvent solution of a clay-like curable silicone composition with a curing speed different from that of the aforementioned composition is further applied; and a method wherein the protective film is covered with a composition by calendering, and an organic solvent solution of a clay-like curable silicone composition with a curing speed different from that of the aforementioned composition is then applied.

Figure 2:
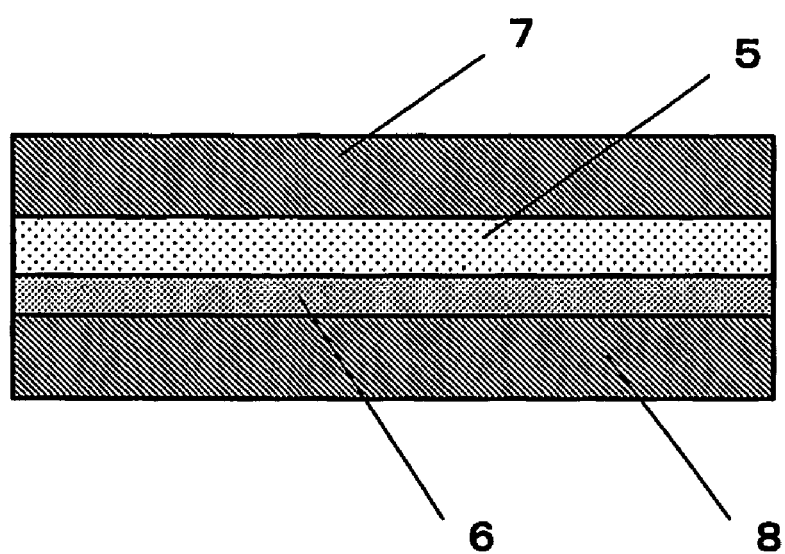
FIG. 2 is a cross-sectional view of the silicone-based adhesive sheet of the present invention created in Example 1 and Examples 3 to 5.

An alternative silicone-based adhesive sheet of this invention is shown in FIG. 2. The sheet has a cured silicone layer 5 on one surface and a clay-like curable silicone composition layer 6 on the other surface. The thickness of the cured layer 5 is not limited, but is preferably 100 μm or less, more preferably 1 to 100 μm and even more preferably 1 to 50 μm. The thickness of the composition layer 6 is also not limited, but is preferably 100 μm or less, more preferably 1 to 100 μm, and even more preferably 1 to 50 μm. The thickness of the sheet is also not limited, but is preferably 1 μm or less.

The cured layer 5 is formed, for example, by curing a hydrosilylation-curable silicone composition, a condensation-curable silicone composition, a silicone composition curable by radical reactions involving organic peroxides, a silicone composition curable by high-energy radiation, or another curable silicone composition, but is preferably formed by curing a hydrosilylation-curable silicone composition. The properties of the cured product are not limited, but are preferably those of an elastomer, and particularly preferably those of rubber.

In this sheet, the plasticity number of the clay-like curable silicone composition, as specified by JIS K 6249 is not limited, but is preferably 100 to 800, more preferably 100 to 700, and even more preferably 100 to 500. According to the specifications in JIS K 6249, this plasticity number is the value when a load of 49±0.05N is applied for 3 minutes to a specimen {a cylindrical object (diameter: 16 mm, height: 10 mm) with a volume of 2±0.02 cubic centimeters ($cm^3$)} by means of a parallel plate plastimeter (William's Plastimeter).

The properties of the cured silicone composition obtained by curing the clay-like curable silicone composition are not limited, but are preferably those of an elastomer, and particularly preferably those of rubber. The cured structure of this curable silicone composition is not limited, and examples thereof include a hydrosilylation-curable silicone composition, a condensation-curable silicone composition, a silicone composition curable by radical reactions involving organic peroxides, and a curable silicone composition curable by high-energy radiation, with a hydrosilylation-curable silicone composition being particularly preferred. The hydrosilylation-curable silicone composition is as previously described.

In FIG. 2, protective films 7 and 8 are firmly bonded to both surfaces of the silicone-based adhesive sheet. The use of these protective films is optional, but the protective films are preferably firmly bonded to either side or both sides of the sheet because they prevent dust from depositing on the front surface of the sheet. The protective films are peeled off when the sheet is used. The protective films 7 and 8 may be the same or different. Examples of such protective films include the same films as previously described.

The method for preparing the sheet is not limited, and examples include a method wherein a solution of a clay-like curable silicone composition in toluene, heptane, or another such organic solvent is applied to a protective film, an organic solvent solution of a clay-like curable silicone composition with a curing speed different from that of the aforementioned composition is similarly applied to another film, the clay-like curable silicone compositions are then laminated together, and then only one of the clay-like curable silicone compositions is cured; a method wherein an organic solvent solution of a curable silicone composition is applied to a protective film and the composition is cured, and an organic solvent solution of the clay-like curable silicone composition is then applied to the cured product; a method wherein a liquid curable silicone composition is applied to a protective film, the composition is cured, a solution of the clay-like curable silicone composition in toluene, heptane, or another such organic solvent is then applied to another protective film, and the films are laminated together; a method wherein component (C) or component (E) is applied to a protective film, an organic solvent solution of the clay-like curable silicone composition is similarly applied to another protective film, component (C) or component (E) is laminated together with the clay-like curable silicone composition, and only one surface of the clay-like curable silicone composition is then cured; and a method wherein a protective film is covered with a curable silicone composition by calendering, the composition is cured, and then an organic solvent solution of the clay-like curable silicone composition is applied to the cured product.

Such a silicone-based adhesive sheet of the present invention is useful as an adhesive sheet for all types of bases because it can satisfactorily bond a smooth base and a base having irregularities in the surface, and can make the thickness of the bonded layer nearly uniform. In particular, using the silicone-based adhesive sheet of the present invention as an adhesive for a chip attachment component and a semiconductor chip having irregularities in at least one surface is advantageous in that the thickness of the bonded layer can be made nearly uniform, and therefore no inconveniences occur during subsequent wire bonding processes. Such a silicone-based adhesive sheet of the present invention is suitable as an adhesive for bonding a semiconductor chip having irregularities in at least one surface to a chip attachment component. The sheet preferably has a low content of uranium and thorium. The sheet also preferably has a low content of sodium, potassium, and other such alkali metal ions or halogen ions. Furthermore, the sheet preferably has a low content of low-molecular siloxanes.

Method for Bonding the Semiconductor Chip and Chip Attachment Component

Figure 3:
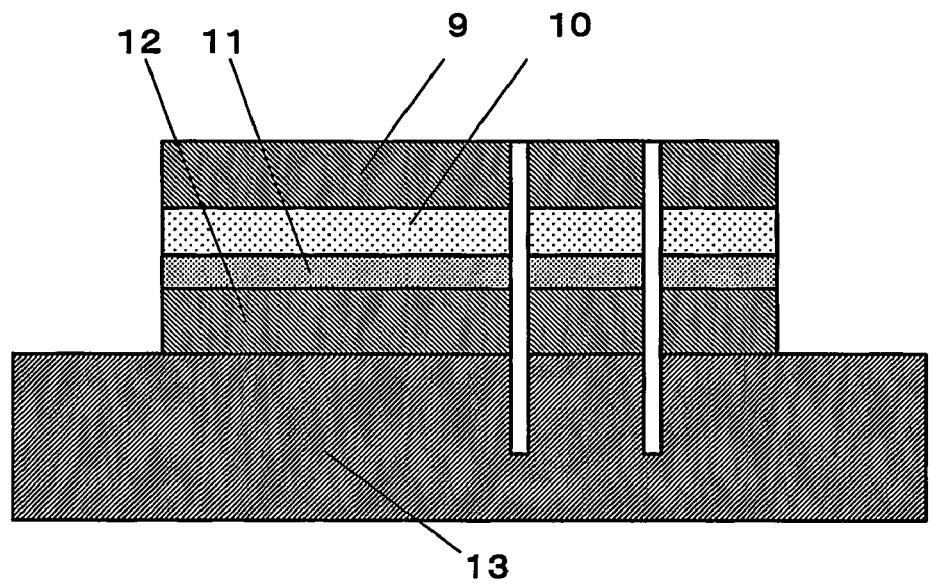
FIG. 3 is a cross-sectional view of the partially diced wafer created in Example 6 relating to the method for bonding the semiconductor chip and the chip attachment component of the present invention.

FIG. 3 illustrates the method for bonding the semiconductor chip and the chip attachment component of this invention. This method comprises the steps of:

(1) producing a semiconductor chip by dicing a laminated body composed of a cured silicone layer 10 bonded to a wafer 9, a layer of clay-like curable silicone composition 11 firmly bonded to the cured layer 10, a protective film 12 firmly bonded to the composition layer 11, and a sheet 13 adhesively attached to the film 12;

(2) peeling the protective film 12 and the sheet 13 from the chip;

(3) bonding the semiconductor chip to the chip attachment component by pressing the semiconductor chip to the chip attachment component via the composition layer 11; and (4) curing the composition layer 11.

Examples of the method for forming a laminated body comprising the cured silicone layer 10 bonded to the wafer 9 and the clay-like curable silicone composition layer 11 firmly bonded to the cured layer 10 include a method of curing the layer of composition (I) in a laminated body comprising a layer of clay-like curable silicone composition (I) firmly bonded to the wafer, and a layer of clay-like curable silicone composition (II) firmly bonded to composition (I) and endowed with a lower curing rate than the layer of composition (I), such that the layer of composition (II) is prevented from being cured; and a method wherein the cured product layer of the cured silicone substance formed by laminating a cured silicone substance layer and a layer of clay-like curable silicone composition firmly bonded to the cured product on the wafer is bonded to the wafer such that the clay-like curable silicone composition is prevented from being cured. The silicone-based adhesive sheet used in these methods is as previously described.

Next, the adhesive sheet 13 is laminated to the protective film 12 and is diced from the wafer 9 side. The adhesive sheet 13 may then be cut to nearly the middle. The semiconductor chip and the chip attachment component can be bonded by peeling off the protective film 12 and the adhesive sheet 13 from the semiconductor chip thus obtained, and bonding the chip under pressure to the semiconductor chip attachment component via the clay-like curable silicone composition layer 11, and then curing the composition layer 11. The bonding conditions are not particularly limited, but it is preferable, for example, to heat to 50 to 250° C., and more preferable to heat to 100 to 150° C. The press-bonding time is preferably 1 second to 2 hours. The pressure is not particularly limited as long as the semiconductor chip or the chip attachment component is not damaged, but is preferably within a range of 0.3 to 2.0 megapascals (MPa).

Semiconductor Device

In the semiconductor device of this invention, the semiconductor chip is bonded to the chip attachment component by the above-mentioned silicone-based adhesive sheet, and examples of the semiconductor device include a diode, transistor, thyristor, monolithic integrated circuit (IC), hybrid IC, large scale integrated circuit (LSI), and very large scale integrated circuit (VLSI), and a package referred to as chip scale package (CSP) is also included in the semiconductor device of the present invention. Examples of the semiconductor chip include diodes, transistors, thyristors, monolithic ICs, and semiconductor chips and circuit board elements on which such semiconductor chips are mounted in hybrid ICs, LSIs, and VLSIs.

Examples of the semiconductor chip attachment component include ceramics, glass, epoxy resins, polyimide resins, phenol resins, Bakelite resins, melamine resins, glass fiber reinforced epoxy resins, glass fiber reinforced BT resins, and other such circuit boards, as well as chip carriers and tabs. Examples of the bonding wire include gold, silver, aluminum, and other such metallic thin wires. Ultrasonic thermocompression bonding is commonly used as the method for connecting the bonding wire.

Examples of the semiconductor device include a semiconductor device comprising a silicone-based adhesive sheet having a layer of clay-like curable silicone composition (I) on one side and having a layer of a slower curing clay-like curable silicone composition (II) than the layer of composition (I) on the other side, whereby, when the semiconductor chip is bonded to the chip attachment component, (i) the layer of composition (I) is cured so that the layer of composition (II) remains uncured while the layer of composition (I) is kept in contact with a semiconductor chip, and the layer of composition (II) is subsequently cured while kept in contact with a semiconductor chip attachment component, or alternatively, a semiconductor device whereby (ii) the layer of composition (I) is cured so that the layer of composition (II) remains uncured while the layer of composition (I) is kept in contact with the semiconductor chip attachment component, and the layer of composition (I) is subsequently cured while kept in contact with the semiconductor chip.

The conditions for bonding the silicone-based adhesive sheet to the semiconductor chip or the chip attachment component are not particularly limited but, for example, heating is preferably performed at 50 to 250° C., and more preferably at 100 to 150° C. The press-bonding time is preferably 1 second to 2 hours. The pressure is not particularly limited as long as the semiconductor chip or the chip attachment component is not damaged, but is preferably 0.3 to 2.0 MPa.

In the semiconductor device according to (i) above, the layer of clay-like curable silicone composition (I) is bonded to a semiconductor chip, and the surface of the semiconductor chip may be either smooth or irregular. In the above-mentioned bonding conditions, the layer of cured product (I) must then be cured under conditions wherein the layer of clay-like curable silicone composition (II) is not cured. The layer of clay-like curable silicone composition (II) is then bonded to the semiconductor chip attachment component, and the surface of the attachment component may either be smooth or irregular. Next, the layer of composition (II) can be bonded by being curing under the above-mentioned bonding conditions.

In the semiconductor device according to (ii) above, the layer of clay-like curable silicone composition (I) is bonded to a semiconductor chip attachment component, and the surface of the chip attachment component may be either smooth or irregular. In the above-mentioned bonding conditions, the layer of cured product (I) must then be cured under conditions wherein the layer of clay-like curable silicone composition (II) is not cured. The layer of clay-like curable silicone composition (II) is then bonded to the semiconductor chip attachment component, and the surface of the attachment component may either be smooth or irregular. Next, the layer of composition (II) can be bonded by curing under the above-mentioned bonding conditions.

Examples of this semiconductor device, in which a silicone-based adhesive sheet having a cured silicone layer on one side and having a layer of clay-like curable silicone composition on the other side is used to bond a semiconductor chip to the chip attachment component, include (iii) a semiconductor device wherein the cured layer is bonded so that the composition layer remains uncured while the cured layer is kept in contact with the semiconductor chip, and the composition layer is subsequently cured while kept in contact with the semiconductor chip attachment component, or alternatively, (iv) a semiconductor device wherein the cured layer is bonded so that the composition layer remains uncured while the cured layer is kept in contact with the semiconductor chip attachment component, and the composition layer is subsequently cured while kept in contact with the semiconductor chip.

The conditions for bonding the silicone-based adhesive sheet to the semiconductor chip or the chip attachment component are not particularly limited, but it is preferable, for example, to heat to 50 to 250° C., and is more preferable to heat to 100 to 150° C. The press-bonding time is preferably 1 second to 2 hours. The pressure is not particularly limited as long as the semiconductor chip or the chip attachment component is not damaged, but is preferably within a range of 0.3 to 2.0 MPa.

Particularly, in the above-mentioned (iii) semiconductor device, the semiconductor chip must have a smooth surface because the silicone cured layer is bonded to the semiconductor chip, and in the above-mentioned bonding conditions, the cured layer must be bonded under conditions wherein the layer of clay-like curable silicone composition is not cured. The layer of clay-like curable silicone composition is then bonded to the semiconductor chip attachment component, and the surface of the chip attachment component preferably has irregularities. Next, the composition can be bonded by curing under the above-mentioned bonding conditions.

In the above-mentioned (iv) semiconductor device, the chip attachment component must have a smooth surface because the silicone cured layer is bonded to the semiconductor chip attachment component, and in the above-mentioned bonding conditions, the cured layer must be bonded under conditions wherein the layer of clay-like curable silicone composition is not cured. The layer of clay-like curable silicone composition is then bonded to the semiconductor chip, and the surface of the chip preferably has irregularities. Next, the composition can be bonded by curing under the above-mentioned bonding conditions.

EXAMPLES

In the examples, the viscosity is the value at 25° C. The plasticity numbers of the clay-like curable silicone compositions are the values when a load of 49±0.05N is applied for 3 minutes to a specimen {a cylindrical object (diameter: 16 mm, height: 10 mm) with a volume of 2±0.02 cm$^3$} by means of a parallel plate plastimeter (William's Plastimeter) according to the specifications in JIS K 6249. The curing speeds of the clay-like curable silicone compositions are shown based on their 90% vulcanizing times {$t_c(90)$} measured under the same temperature conditions (for example, 130° C., 150° C.) in vulcanizing tests performed using an oscillating vulcanizing tester, as specified by JIS K 6300. Furthermore, the hardness of the cured silicone substance is measured by a type-A durometer, as specified by JIS K 6253.

Reference Example 1

Preparation of Clay-Like Silicone Rubber Composition I

A silicone rubber base was created with a kneader mixer by heating and mixing 100 parts by weight (weight average molecular weight=370,000) of dimethylsiloxane/methylvinylsiloxane copolymer raw rubber blocked with dimethylvinylsiloxy groups at both ends of the molecular chain, comprising 99.85 mol % dimethylsiloxane units and 0.15 mol % methylvinylsiloxane units, 10.0 parts by weight or dimethylsiloxane oligomer blocked with silanol groups at both ends of the molecular chain with a viscosity of 60 mPa·s, and 40 parts by weight of flumed silica (AEROSIL 200®; made by Japan Aerosil Co., Ltd.; BET specific surface area: 200 square meters per gram (m$^2$/g)).

Next, two rolling mills were used to uniformly mix 100 parts by weight of the silicone rubber base, 0.8 parts by weight of methylhydrogenpolysiloxane blocked with trimethylsiloxy groups at both ends of the molecular chain with a viscosity of 30 mPa·s (the amount of silicon-bonded hydrogen atoms in the methylhydrogenpolysiloxane was 3.1 mol per mole of the vinyl groups in the dimethylsiloxane/methylvinylsiloxane copolymer raw rubber that was blocked with dimethylvinylsiloxy groups at both ends of the molecular chain and was contained in the above-mentioned silicone rubber base), 0.05 parts by weight of an organosilane shown by the formula

as a curing inhibitor, and 1.0 parts by weight of an organosiloxane shown by the average unit formula

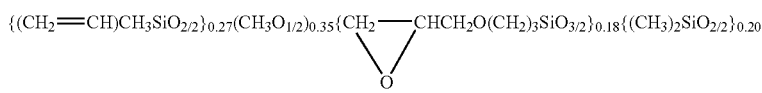

as an adhesion promoter, then a 1,3-divinyltetramethyldisiloxane solution of a 1,3-divinyltetramethyldisiloxane complex of platinum (in the present composition, the amount of platinum metal in the complex was 20 ppm in weight units) was mixed to create the clay-like silicone rubber composition (I).

The plasticity number of the clay-like curable silicone composition (I) was 240. The curing speed of the clay-like curable silicone composition (I) had a $t_c(90)$, as specified by JIS K 6300, of 2.5 minutes at 130° C. and 1 minute at 150° C. The hardness of the silicone rubber obtained by curing was 60.

Next, 20 parts by weight of the clay-like silicone rubber composition (I) and 80 parts by weight of toluene were stirred in a separable flask to create a toluene solution of the clay-like silicone rubber composition (I) with a viscosity of 3,500 mPa·s.

Reference Example 2

Preparation of Clay-Like Silicone Rubber Composition II

A silicone rubber base was created with a kneader mixer by heating and mixing 100 parts by weight (weight average molecular weight=370,000) of dimethylsiloxane/methylvinylsiloxane copolymer raw rubber blocked with dimethylvinylsiloxy groups at both ends of the molecular chain, comprising 99.85 mol % dimethylsiloxane units and 0.15 mol % methylvinylsiloxane units, 10.0 parts by weight of dimethylsiloxane oligomer blocked with silanol groups at both ends of the molecular chain with a viscosity of 60 mPa·s, and 40 parts by weight of fumed silica (AEROSIL 200®; made by Japan Aerosil Co., Ltd.; BET specific surface area: 200 m²/g).

Next, two rolling mills were used to uniformly mix 100 parts by weight of the above-mentioned silicone rubber base, 0.8 parts by weight of methylhydrogenpolysiloxane blocked with trimethylsiloxy groups at both ends of the molecular chain with a viscosity of 30 mPa·s (the amount of silicon-bonded hydrogen atoms in the methylhydrogenpolysiloxane was 3.1 mol per mole of the vinyl groups in the dimethylsiloxane/methylvinylsiloxane copolymer raw rubber that was blocked with dimethylvinylsiloxy groups at both ends of the molecular chain and was contained in the above-mentioned silicone rubber base), 0.2 parts by weight of an organosilane shown by the formula

as a curing inhibitor, and 1.0 parts by weight of an organosiloxane shown by the average unit formula as an adhesion promoter, then a 1,3-divinyltetramethyldisiloxane solution of a 1,3-divinyltetramethyldisiloxane complex of platinum (in the present composition, the amount of platinum metal in the complex was 20 ppm in weight units) was mixed to create the clay-like silicone rubber composition (II).

The plasticity number of the clay-like silicone composition (II) was 240. The curing speed of the clay-like silicone composition (II) had a $t_c(90)$, as specified by JIS K 6300 of 40 minutes at 130° C. and 10 minutes at 150° C. The hardness of the silicone rubber obtained by curing was 60.

Next, 20 parts by weight of the above-mentioned clay-like silicone rubber composition (II) and 80 parts by weight of toluene were stirred in a separable flask to create a toluene solution of the clay-like silicone rubber composition (II) with a viscosity of 3,500 mPa·s.

Reference Example 3

Preparation of Clay-Like Silicone Rubber Composition III

A silicone rubber base was created with a kneader mixer by heating and mixing 100 parts by weight (weight average molecular weight=370,000) of dimethylsiloxane/methylvinylsiloxane copolymer raw rubber blocked with dimethylvinylsiloxy groups at both ends of the molecular chain, comprising 99.85 mol % dimethylsiloxane units and 0.15 mol % methylvinylsiloxane units, 10.0 parts by weight or dimethylsiloxane oligomer blocked with silanol groups at both ends of the molecular chain with a viscosity of 60 mPa·s, and 40 parts by weight of fumed silica (AEROSIL 200®; made by Japan Aerosil Co., Ltd.; BET specific surface area: 200 square meters per gram (m²/g)).

Next, two rolling mills were used to uniformly mix 100 parts by weight of the silicone rubber base, 0.8 parts by weight of methylhydrogenpolysiloxane blocked with tiimethylsiloxy groups at both ends of the molecular chain with a viscosity of 30 mPa·s (the amount of silicon-bonded hydrogen atoms in the methylhydrogenpolysiloxane was 3.1 mol per mole of the vinyl groups in the dimethylsiloxane/methylvinylsiloxane copolymer raw rubber that was blocked with dimethylvinylsiloxy groups at both ends of the molecular chain and was contained in the above-mentioned silicone rubber base), 0.2 parts by weight of an organosilane shown by the formula

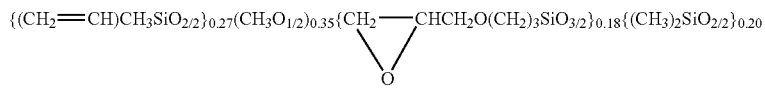

as a curing inhibitor, and 1.0 parts by weight of an organosiloxane shown by the average unit formula

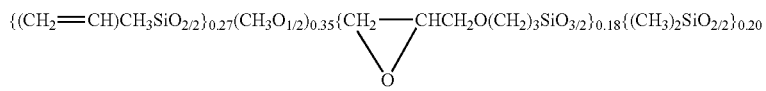

as an adhesion promoter, then a 1,3-divinyltetramethyldisiloxane solution of a 1,3-divinyltetramethyldisiloxane complex of platinum (in the present composition, the amount of platinum metal in the complex was 20 ppm in weight units) was mixed to create the clay-like silicone rubber composition (III).

The plasticity number of the clay-like curable silicone composition (III) was 240. The curing speed of the clay-like curable silicone composition (III) had a $t_c(90)$, as specified by JIS K 6300, of 40 minutes at 130° C. and 10 minute at 150° C. The hardness of the silicone rubber obtained by curing was 60.

Next, 20 parts by weight of the clay-like silicone rubber composition (I) and 80 parts by weight of toluene were stirred in a separable flask to create a toluene solution of the clay-like silicone rubber composition (III) with a viscosity of 3,500 mPa·s.

Example 1

A silicone rubber sheet with a thickness of 5 μm firmly bonded to a polyester sulfone resin film was created by using a scraper to apply the toluene solution of the clay-like silicone rubber composition (II) created in Reference Example 2 with a thickness of 25 μm to the polyester sulfone resin film, then blow-drying the result at room temperature for 2 hours, and curing the clay-like silicone rubber composition (II) by heating for 30 minutes at 150° C.

Next, a scraper was used to apply the toluene solution of the clay-like silicone rubber composition (II) created in Reference Example 2 with a thickness of 225 μm to the silicone rubber sheet, and the result was blow-dried at room temperature for 2 hours. The total thickness of the blow-dried silicone rubber sheet and clay-like silicone rubber composition layer was 50 μm. Next, a polyester sulfone resin film was firmly bonded to the surface of the clay-like silicone rubber composition layer by means of a rubber roller, and the silicone rubber layer and the clay-like silicone rubber composition layer shown in FIG. 2 were laminated to create a silicone-based adhesive sheet in which a polyester sulfone resin film was firmly bonded to both surfaces as a protective film.

The silicone-based adhesive sheet was cut into squares 10 mm on a side, the polyester sulfone resin film firmly bonded to the silicone rubber layer was peeled off, a silicon chip 10 mm on a side was press-bonded for 1 second at 190° C. and a pressure of 1.0 MPa, the polyester sulfone resin film firmly bonded to the clay-like silicone rubber composition layer was peeled off, the layer was press-bonded for 1 second at 190° C. and a pressure of 1.0 MPa to the wiring surface of a board made from a glass fiber reinforced epoxy resin with 20 μm irregularities, and the result was heated for 60 minutes at 150° C. to cure the clay-like silicone rubber composition, creating a device.

The total thickness of the device was measured, and the thickness of the silicone adhesive layer at the four corners of the chip was measured by subtracting the thickness of the silicon chip and the board made from a glass fiber reinforced epoxy resin, whereupon the thickness of the silicone adhesive layer was found to be uniform at 48 μm in all cases. The silicon chip was pulled upward to confirm adhesiveness, and it was found that the silicone adhesive layer had undergone a cohesive failure, confirming that the adhesiveness was satisfactory.

Figure 4:
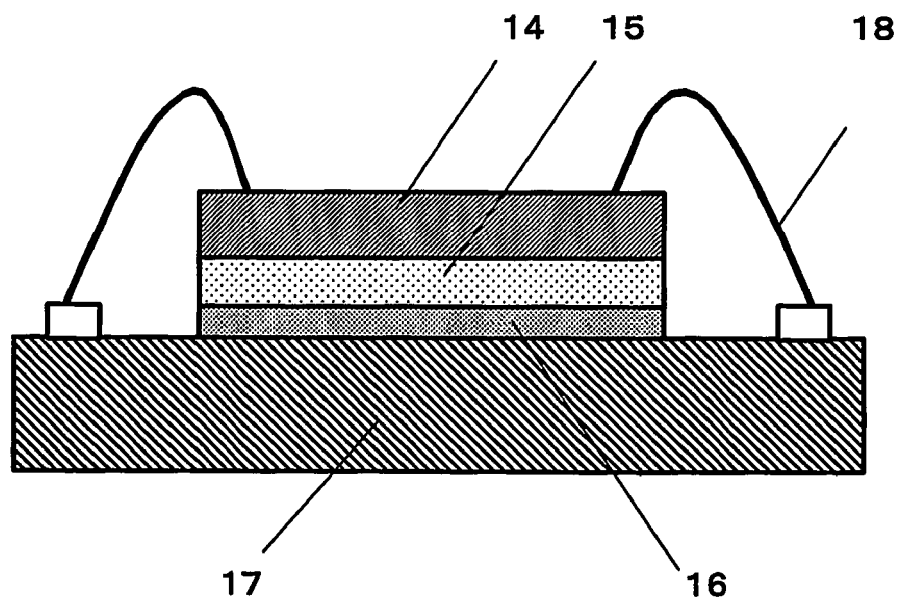
FIG. 4 is a cross-sectional view of the semiconductor device of the present invention created in Examples 1 to 6.

Next, a metal wire with a diameter of 30 μm was bonded to the above-mentioned device by ultrasonic thermocompression bonding to create the semiconductor device shown in FIG. 4. Thirty of these semiconductor devices were let to stand for 30 minutes at −50° C., then were immediately subjected to a heat cycle test wherein a 30 minutes standing at 150° C. was one cycle, and the conductive fraction defective of the above-mentioned device was evaluated. The results thereof are shown in Table 1.

Example 2

A toluene solution of the clay-like silicone rubber composition (I) created in Reference Example 1 was applied with a thickness of 50 μm to a polyester sulfone resin film different from that mentioned above using a scraper, and the result was blow-dried for 2 hours at room temperature. The thickness of the layer of clay-like silicone rubber composition (I) after drying was 5 μm.

A toluene solution of the clay-like silicone rubber composition (II) created in Reference Example 2 was applied with a thickness of 225 μm to a polyester sulfone resin film different from that mentioned above using a scraper, and the result was blow-dried for 2 hours at room temperature. The thickness of the layer of clay-like silicone rubber composition (II) after drying was 45 μm.

Next, the layer of clay-like silicone rubber composition (I) and the layer of clay-like silicone rubber composition (ED were laminated together to create the silicone-based adhesive sheet shown in FIG. 1, comprising a two-layered clay-like silicone rubber composition with a polyester sulfone resin film bonded to both surfaces.

The silicone-based adhesive sheet was cut into squares 10 mm on a side, the polyester sulfone resin film firmly bonded to the layer of clay-like silicone rubber composition (I) was peeled off, the layer of clay-like silicone rubber composition (I) was cured by press-bonding a silicone chip 10 mm on a side for 2 minutes at 150° C. and a pressure of 1.0 MPa, then the polyester sulfone resin film firmly bonded to the layer of clay-like silicone rubber composition (II) was peeled off, the layer was press-bonded for 1 second at 190° C. and a pressure of 1.0 MPa to the wiring surface of a board made from a glass fiber reinforced epoxy resin with 20 μm irregularities, and the result was heated for 60 minutes at 150° C. to cure the clay-like silicone rubber composition, creating a device.

The total thickness of the device was measured, and the thickness of the silicone adhesive layer at the four corners of the chip was measured by subtracting the thickness of the chip and the board made from a glass fiber reinforced epoxy resin, whereupon the thickness of the silicone adhesive layer was found to be uniform at 48 μm in all cases. The silicon chip was pulled upward to confirm adhesiveness, and it was found that the silicone adhesive layer had undergone a cohesive failure, confirming that the adhesiveness was satisfactory.

Next, a metal wire with a diameter of 30 μm was bonded to the above-mentioned device by ultrasonic thermocompression bonding to create the semiconductor device shown in FIG. 4. Thirty of these semiconductor devices were let to stand for 30 minutes at −50° C., then were immediately subjected to a heat cycle test wherein a 30 minutes standing at 150° C. was one cycle, and the conductive fraction defective of the above-mentioned device was evaluated. The results thereof are shown in Table 1.

Example 3

Only the layer of clay-like silicone rubber composition (I) was cured by heating the silicone-based adhesive sheet created in Example 2 for 10 minutes at 130° C., creating the silicone-based adhesive sheet shown in FIG. 2, wherein the silicone rubber layer and the layer of clay-like silicone rubber composition (II) are laminated and the polyester sulfone resin film is firmly bonded to both surfaces as a protective film.

The silicone-based adhesive sheet was cut into squares 10 mm on a side, the polyester sulfone resin film firmly bonded to the silicone rubber layer was peeled off, a silicone chip 10 mm on a side was press-bonded for 1 second at 190° C. and a pressure of 1.0 MPa, then the polyester sulfone resin film firmly bonded to the layer of clay-like silicone rubber composition (II) was peeled off, the layer was press-bonded for 1 second at 190° C. and a pressure of 1.0 MPa to the wiring surface of a board made from a glass fiber reinforced epoxy resin with 20 μm irregularities, and the result was heated for 60 minutes at 150° C. to cure the layer of clay-like silicone rubber composition (II), creating a device.

The total thickness of the device was measured and the thickness of the silicone adhesive layer at the four corners of the chip was measured by subtracting the thickness of the chip and the board made from a glass fiber reinforced epoxy resin, whereupon the thickness of the silicone adhesive layer was found to be uniform at 48 μm in all cases. The silicone chip was pulled upward to confirm adhesiveness, and it was found that the silicone adhesive layer had undergone a cohesive failure, confirming that the adhesiveness was satisfactory.

Next, a metal wire with a diameter of 30 μm was bonded to the above-mentioned device by ultrasonic thermocompression bonding to create the semiconductor device shown in FIG. 4. Thirty of these semiconductor devices were let to stand for 30 minutes at −50° C., then were immediately subjected to a heat cycle test wherein a 30 minutes standing at 150° C. was one cycle, and the conductive fraction defective of the above-mentioned device was evaluated. The results thereof are shown in Table 1.

Example 4

A toluene solution of a 1,3-divinyltetramethyldisiloxane complex of platinum contained in an amount of 500 ppm in terms of weight units as platinum metal was coated on a polyester sulfone resin film with a thickness of 50 μm using gauze, and the result was let to stand for 2 hours at room temperature and blow dried.

A toluene solution of the clay-like silicone rubber composition (II) created in Reference Example 2 was applied with a thickness of 250 μm to a polyester sulfone resin film using a scraper, and the result was blow-dried for 2 hours at room temperature. The thickness of the layer of clay-like silicone rubber composition (II) after drying was 50 μm.

Next, the layer of clay-like silicone rubber composition (II) and the surface coated with the 1,3-divinyltetramethyldisiloxane complex of platinum were laminated together to create a clay-like silicone-based adhesive sheet comprising a clay-like silicone rubber composition to which a polyester sulfone resin film was firmly bonded to both surfaces, then only the surface of the layer of clay-like silicone rubber composition (II) in contact with the 1,3-divinyltetramethyldisiloxane complex of platinum was cured by heating the result for 10 minutes at 130° C., and the silicone rubber layer and the layer of clay-like silicone rubber composition were laminated to create a clay-like silicone-based adhesive sheet in which a polyester sulfone resin film was firmly bonded to both surfaces as a protective film. The silicone layer maintained a viscosity of about 30 μm from the clay-like layer side.

The clay-like silicone-based adhesive sheet was cut into squares 10 mm on a side, the polyester sulfone resin film firmly bonded to the silicone rubber layer was peeled off, a silicone chip 10 mm on a side was press-bonded for 1 second at 190° C. and a pressure of 1.0 MPa, then the polyester sulfone resin film firmly bonded to the layer of clay-like silicone rubber composition (II) was peeled off, the layer was press-bonded for 1 second at 190° C. and a pressure of 1.0 MPa to the wiring surface of a board made from a glass fiber reinforced epoxy resin with 20 μm irregularities, and the result was heated for 60 minutes at 150° C. to cure the layer of clay-like silicone rubber composition (II), creating a device.

The total thickness of the device was measured, and the thickness of the silicone adhesive layer at the four corners of the chip was measured by subtracting the thickness of the chip and the board made from a glass fiber reinforced epoxy resin, whereupon the thickness of the silicone adhesive layer was found to be 48 μm in all cases. The silicone chip was pulled upward to confirm adhesiveness, and it was found that the silicone adhesive layer had undergone a cohesive failure, confirming that the adhesiveness was satisfactory.

Next, a metal wire with a diameter of 30 μm was bonded to the above-mentioned device by ultrasonic thermocompression bonding to create a semiconductor device. Thirty of these semiconductor devices were let to stand for 30 minutes at −50° C., then were immediately subjected to a heat cycle test wherein a 30 minutes standing at 150° C. was one cycle, and the number of devices with conductivity defects was evaluated. The results thereof are shown in Table 1.

Example 5

A toluene solution (solids: 10 wt %) of an organopolysiloxane (content of silicon-bonded hydrogen atoms=0.97% by weight) shown by the average unit formula

was coated on a polyester sulfone resin film with a thickness of 50 μm using gauze, and the result was let to stand for 2 hours at room temperature and blow dried.

A toluene solution of the clay-like silicone rubber composition (II) created in Reference Example 2 was applied with a thickness of 250 μm to a polyester sulfone resin film using a scraper, and the result was blow-dried for 2 hours at room temperature. The thickness of the layer of clay-like silicone rubber composition (II) after drying was 50 μm.

Next, the layer of clay-like silicone rubber composition (II) and the surface coated with the organopolysiloxane shown by the average unit formula

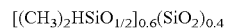

were laminated together to create a silicone-based adhesive sheet comprising a clay-like silicone rubber composition to which a polyester sulfone resin film was firmly bonded on both sides, then only the surface of the layer of clay-like silicone rubber composition (II) in contact with the organopolysiloxane shown by the average unit formula

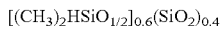

was cured by heating the result for 10 minutes at 130° C., and as shown in FIG. 2, the silicone rubber layer and the layer of clay-like silicone rubber composition were laminated to create a clay-like silicone-based adhesive sheet in which a polyester sulfone resin film was firmly bonded to both surfaces as a protective film. The silicone layer maintained a viscosity of about 30 μm from the clay-like layer side.

The clay-like silicone-based adhesive sheet was cut into squares 10 mm on a side, the polyester sulfone resin film firmly bonded to the silicone rubber layer was peeled off, a silicone chip 10 mm on a side was press-bonded for 1 second at 190° C. and a pressure of 1.0 MPa, then the polyester sulfone resin film firmly bonded to the layer of clay-like silicone rubber composition (II) was peeled off, the layer was press-bonded for 1 second at 190° C. and a pressure of 1.0 MPa to the wiring surface of a board made from a glass fiber reinforced epoxy resin with 20 m irregularities, and the result was heated for 60 minutes at 150° C. to cure the layer of clay-like silicone rubber composition (II), creating a device.

The total thickness of the device was measured, and the thickness of the silicone adhesive layer at the four corners of the chip was measured by subtracting the thickness of the chip and the board made from a glass fiber reinforced epoxy resin, whereupon the thickness of the silicone adhesive layer was found to be uniform 48 μm in all cases. The silicone chip was pulled upward to confirm adhesiveness, and it was found that the silicone adhesive layer had undergone a cohesive failure, confirming that the adhesiveness was satisfactory.

Next, a metal wire with a diameter of 30 μm was bonded to the above-mentioned device by ultrasonic thermocompression bonding to create a semiconductor device. Thirty of these semiconductor devices were let to stand for 30 minutes at −50° C., then were immediately subjected to a heat cycle test wherein a 30 minutes standing at 150° C. was one cycle, and the number of devices with conductivity defects was evaluated. The results thereof are shown in Table 1.

Example 6

The protective film on the clay-like silicone rubber composition (I), created in Example 2, of the silicone-based adhesive sheet wherein the layer of clay-like silicone rubber composition (I) and the layer of clay-like silicone rubber composition (II) were laminated and a protective film was firmly bonded to both surfaces, was peeled off and firmly bonded to a 4-inch silicon wafer prior to dicing using a rubber roller. Next, the result was heated for 10 minutes at 130° C., and only the layer of clay-like silicone rubber composition (I) was cured.

Next, an adhesive sheet with a thickness of 90 μm was laminated to the protective film firmly bonded to the silicone-based adhesive sheet, which was itself bonded to the silicon wafer, and the product was diced into squares 10 mm on a side using a dicing saw DAD 340 made by Disco Corporation. The bottom surface of the adhesive sheet was cut away, leaving 60 μm.

When the diced semiconductor chip was picked up using the adhesive sheet, the protective film remained on the adhesive sheet side. A device was created by a process in which the silicone-based adhesive sheet bonded to the semiconductor chip was press-bonded for 1 second at room temperature at a pressure of 1.0 MPa to the wiring surface of a board made from a glass fiber reinforced epoxy resin with 20 μm irregularities, and the product was then heated for 60 minutes at 150° C. to cure the layer of clay-like silicone rubber composition.

The total thickness of the device was measured, and the thickness of the silicone adhesive layer at the four corners of the chip was measured by subtracting the thickness of the chip and the board made from a glass fiber reinforced epoxy resin, whereupon the thickness of the silicone adhesive layer was found to be uniform at 48 μm in all cases. The silicone chip was pulled upward to confirm adhesiveness, and it was found that the silicone adhesive layer had undergone a cohesive failure, confirming that the adhesiveness was satisfactory.

Next, a metal wire with a diameter of 30 μm was bonded to the above-mentioned device by ultrasonic thermocompression bonding to create the semiconductor device shown in FIG. 4. Thirty of these semiconductor devices were let to stand for 30 minutes at 50° C., then were immediately subjected to a heat cycle test wherein a 30 minutes standing at 150° C. was one cycle, and the number of devices with conductivity defects was evaluated. The results thereof are shown in Table 1.

Comparative Example 1

72 parts by weight of dimethylpolysiloxane blocked with dimethylvinylsiloxy groups at both ends of the molecular chain (content of vinyl groups=0.08% by weight) with a viscosity of 40,000 mPa·s, 15 parts by weight of a dimethylsiloxane/methylvinylsiloxane copolymer blocked with dimethylvinylsiloxy groups at both ends of the molecular chain (content of vinyl groups=0.84% by weight) with a viscosity of 6,000 mPa·s, 1.5 parts by weight of water, 3 parts by weight of hexamethyldisilazane, and 10 parts by weight of fumed silica (AEROSIL 200®; made by Japan Aerosil Co., Ltd.; BET specific surface area 200 m²/g) were mixed for 1 hour at room temperature by means of a Ross mixer, and then heated and mixed for 2 hours at 170° C. under reduced pressure. The result was cooled to room temperature to create a semi-transparent paste silicone rubber base.

Next, 100 parts by weight of the above-mentioned silicone rubber base, 3 parts by weight of a dimethylsiloxane/methylhydrogensiloxane copolymer blocked with trimethylsiloxy groups at both ends of the molecular chain (content of silicon-bonded hydrogen atoms=0.7% by weight) (the amount of silicon-bonded hydrogen atoms in the dimethylsiloxane/methylhydrogensiloxane copolymer blocked with trimethylsiloxy groups at both ends of the molecular chain was 3.0 mol per mole of the vinyl groups in the dimethylpolysiloxane blocked by dimethylvinylsilyl groups at both ends of the molecular chain and in the dimethylsiloxane/methylvinylsiloxane copolymer that was blocked with dimethylvinylsiloxy groups at both ends of the molecular chain and was contained in the above-mentioned silicone rubber base) with a viscosity of 5 mPa·s, 0.01 parts by weight of 3-phenyl-1-butyn-3-ol as a curing inhibitor, and 1.0 part by weight of an organopolysiloxane shown by the average unit formula

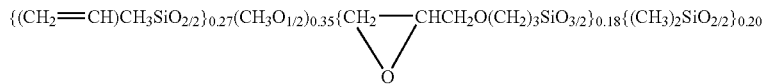

as an adhesion promoter were mixed uniformly, then a 1,3-divinyltetramethyldisiloxane solution of a 1,3-divinyltetramethyldisiloxane complex of platinum (in the present composition, the amount of platinum metal in the complex was 5 ppm in weight units) was mixed in to create a silicone rubber composition (IV) with a viscosity of 70,000 mPa·s.

The silicone rubber composition was sandwiched between polyester sulfone resin films with a thickness of 50 μm, and then cured by heating for 30 minutes in a convection oven at 80° C. while the thickness of the above-mentioned silicone rubber composition was kept at 50 μm by two stainless rollers with an adjusted clearance, thus yielding a silicone-based adhesive sheet.

The silicone-based adhesive sheet was cut into squares 10 mm on a side, one sheet of the polyester sulfone resin film was peeled off, a silicone chip 10 mm on a side was press-bonded for 1 second at 190° C. and a pressure of 1.0 MPa, then the polyester sulfone resin film on the opposite side was peeled off, the layer was press-bonded for 1 second at 190° C. and a pressure of 1.0 MPa to the wiring surface of a board made from a glass fiber reinforced epoxy resin with 20 μm irregularities, and the result was heated for 60 minutes at 150° C. to create a device. In this device, as a result of pulling off the silicone chip upward to confirm adhesiveness, the surfaces of the silicone adhesive layer and the wiring surface of the board made from a glass fiber reinforced epoxy resin peeled off. Therefore, wire bonding could not applied to the above-mentioned device.

Example 7

A silicone rubber sheet with a thickness of 5 μm firmly bonded to a polyester sulfone resin film was created by using a scraper to apply the toluene solution of the clay-like silicone rubber composition (III) created in Reference Example 3 with a thickness of 25 μm to the polyester sulfone resin film, then blow-drying the result at room temperature for 2 hours, and curing the clay-like silicone rubber composition (III) by heating for 30 minutes at 150° C.

Next, a scraper was used to apply the toluene solution of the clay-like silicone rubber composition (III) created in Reference Example 3 with a thickness of 225 μm to the silicone rubber sheet, and the result was blow-dried at room temperature for 2 hours. The total thickness of the blow-dried silicone rubber sheet and clay-like silicone rubber composition layer was 50 μm. Next, a polyester sulfone resin film was firmly bonded to the surface of the clay-like silicone rubber composition layer by means of a rubber roller, and the silicone rubber layer and the clay-like silicone rubber composition layer shown in FIG. 2 were laminated to create a silicone-based adhesive sheet (L) in which a polyester sulfone resin film was firmly bonded to both surfaces as a protective film.

While, a silicone rubber base was created with a Ross® mixer by mixing 31 parts by weight of dimethylpolysiloxane blocked with dimethylvinylsiloxy groups at both ends of the molecular chain (content of vinyl groups=0.23% by weight; content of low-molecular-weight siloxanes with vapor pressure≧10 mmHg at 200° C.=0.01% by weight) with a viscosity of 2,200 mPa·s, 56 parts by weight of an organopolysiloxane mixture with a viscosity of 7,000 mPa·s, consisting of 65% by weight of dimethylpolysiloxane blocked with dimethylvinylsiloxy groups at both ends of the molecular chain (content of vinyl groups=0.23% by weight) with a viscosity of 2,000 mPa·s and 35% by weight of an organopolysiloxane resin (content of vinyl groups=2.5% by weight) composed of the $(CH_2=CH(CH_3)_2SiO_{1/2}$ unit and the $SiO_2$ unit, and 13 parts by weight of fumed silica (AEROSIL 200®; made by Japan Aerosil Co., Ltd.; BET specific surface area 200 m²/g), then by heating and mixing for 2 hours at 170° C. under reduced pressure. The result was cooled to room temperature to create a semi-transparent paste silicone rubber base.

Next, 100 parts by weight of the above-mentioned silicone rubber base, 6 parts by weight of a dimethylsiloxane/methylhydrogensiloxane copolymer blocked with trimethylsiloxy groups at both ends of the molecular chain (content of silicon-bonded hydrogen atoms=0.7% by weight) (the amount of silicon-bonded hydrogen atoms in the dimethylsiloxane/methylhydrogensiloxane copolymer blocked with trimethylsiloxy groups at both ends of the molecular chain was 1.8 mol per mole of the vinyl groups in the dimethylpolysiloxane blocked by dimethylvinylsilyl groups at both ends of the molecular chain and in the organopolysiloxane mixture and was contained in the above-mentioned silicone rubber base) with a viscosity of 5 mPa·s, 1.0 part by weight of an organopolysiloxane shown by the average unit formula

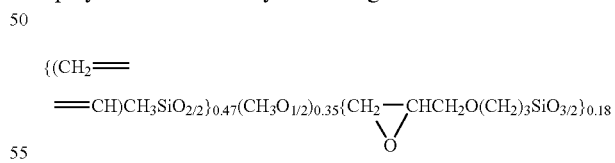

as an adhesion promoter, and 0.5 part by weight of a silatran shown by the formula

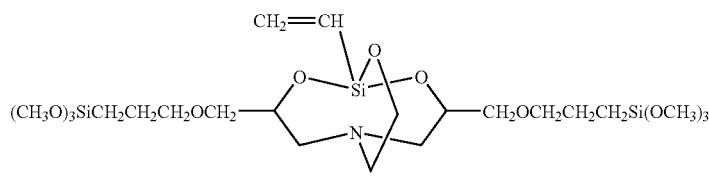

as an adhesion promoter were mixed uniformly, then a 1,3-divinyltetramethyldisiloxane solution of a 1,3-divinyltetramethyldisiloxane complex of platinum (in the present composition, the amount of platinum metal in the complex was 5 ppm in weight units) was mixed in to create a silicone rubber composition (V) with a viscosity of 70,000 mPa·s.

The silicone rubber composition (V) was sandwiched between 50 µm-thick polyethylene terephthalate resin film having 2 µm-thick polyester sulfone resin layer on a surface of the film and 50 µm-thick polyethylene terephthalate resin film having 2 µm-thick acetate cellulose resin layer on a surface of the film, and then cured by heating for 30 minutes in a convection oven at 80° C. while the thickness of the above-mentioned silicone rubber composition was kept at 30 µm by two stainless rollers with an adjusted clearance, thus yielding a silicone-based adhesive sheet (M).

The protective film on the silicone rubber layer of the silicone-based adhesive sheet (L) was peeled off and firmly bonded to a 4-inch silicon wafer prior to dicing using a rubber roller. Next, the result was heated for 30 minutes at 100° C., and only the layer of silicone rubber and the silicone wafer were bonded. Next, an adhesive sheet with a thickness of 90 µm was laminated to the protective film firmly bonded to the silicone-based adhesive sheet (L), which was itself bonded to the silicon wafer, and the product was diced into squares 10 mm on a side using a dicing saw DAD 340 made by Disco Corporation. The bottom surface of the adhesive sheet was cut away, leaving 60 µm.

When the diced semiconductor chip was picked up using the adhesive sheet, the protective film remained on the adhesive sheet side. A device was created by a process in which the silicone-based adhesive sheet bonded to the semiconductor chip was press-bonded for 1 second at room temperature at a pressure of 1.0 MPa to the wiring surface of a board made from a glass fiber reinforced epoxy resin with 20 µm irregularities, and the product was then heated for 60 minutes at 150° C. to cure the layer of clay-like silicone rubber composition.

The total thickness of the device was measured, and the thickness of the silicone adhesive layer at the four corners of the chip was measured by subtracting the thickness of the silicon chip and the board made from a glass fiber reinforced epoxy resin, whereupon the thickness of the silicone adhesive layer was found to be uniform at 48 µm in all cases. The silicon chip was pulled upward to confirm adhesiveness, and it was found that the silicone adhesive layer had undergone a cohesive failure, confirming that the adhesiveness was satisfactory.

The protective film (the polyethylene terephtalate resin film having the acetate cellulose resin layer on the surface of the film) on the silicone rubber layer of the silicone rubber-based adhesive sheet (M) was peeled off and firmly bonded to a 4-inch silicon wafer prior to dicing using a rubber roller. Next, the result was heated for 30 minutes at 100° C., and only the layer of silicone rubber and the silicone wafer were bonded. Next, an adhesive sheet with a thickness of 90 µm was laminated to the protective film firmly bonded to the silicone rubber-based adhesive sheet (M), which was itself bonded to the silicon wafer, and the product was diced into squares 5 mm on a side using a dicing saw DAD 340 made by Disco Corporation. The bottom surface of the adhesive sheet was cut away, leaving 60 µm.

When the diced semiconductor chip was picked up using the adhesive sheet, the protective film remained on the adhesive sheet side. A device was created by a process in which the silicone-based adhesive sheet (M) bonded to the semiconductor chip was press-bonded for 1 second at room temperature at a pressure of 1.0 MPa to said semiconductor chip bonded by the silicone-based adhesive sheet (L) on the wiring surface of a board made from a glass fiber reinforced epoxy resin, and the product was then heated for 60 minutes at 150° C.

Figure 5:
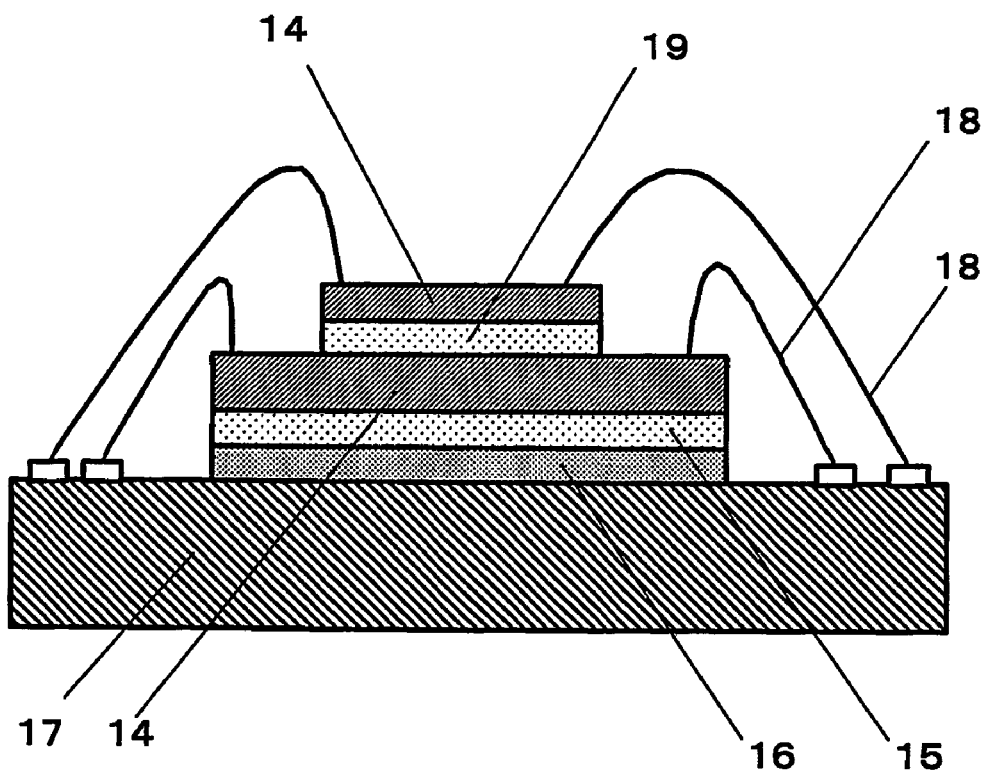
FIG. 5 is a cross-sectional view of the semiconductor device of the present invention created in Examples 7.

Next, a metal wire with a diameter of 30 m was bonded to the above-mentioned device by ultrasonic thermocompression bonding to create the semiconductor device shown in FIG. 5. Thirty of these semiconductor devices were let to stand for 30 minutes at −50° C., then were immediately subjected to a heat cycle test wherein a 30 minutes standing at 150° C. was one cycle, and the conductive fraction defective of the above-mentioned device was evaluated. The results thereof are shown in Table 1.

TABLE 1

| Item | Section | Embodiments | | | | | | |
|---|---|---|---|---|---|---|---|---|
| | | 1 | 2 | 3 | 4 | 5 | 6 | 7 |
| Parts with conductivity defects (%) | 100 cycles | 0 | 0 | 0 | 0 | 0 | 0 | 0 |
| | 500 cycles | 0 | 0 | 0 | 0 | 0 | 0 | 0 |
| | 1000 cycles | 0 | 0 | 0 | 0 | 0 | 0 | 0 |

INDUSTRIAL APPLICABILITY

The silicone-based adhesive sheet of the present invention is characterized in that it can be satisfactorily bonded to a smooth base and a base having irregularities in the surface, and the thickness of the bonded layer can be made uniform. Particularly, the silicone-based adhesive sheet of the present invention is suitable for bonding a semiconductor chip having irregularities in at least one surface and a chip attachment component. The method for bonding the semiconductor chip and the chip attachment component of the present invention is characterized in that the semiconductor chip and the chip attachment component can be satisfactorily bonded even if they have irregularities in at least one surface. The semiconductor device of the present invention is characterized in that the semiconductor chip and the chip attachment component can be satisfactorily bonded with superior reliability even if they have irregularities in at least one surface.

The invention claimed is:

1. A silicone-based adhesive sheet comprising a first layer and a second layer disposed adjacent to and in contact with said first layer; wherein said first layer comprises
   (I) a hydrosilylation-curable silicone composition comprising
      (A) an organopolysiloxane having at least two alkenyl groups per molecule,
      (B) a filler,
      (C) an organopolysiloxane having at least two silicon-bonded hydrogen atoms per molecule,
      (D) an adhesion promoter, and
      (E) a hydrosilylation catalyst; said second layer comprises
   (II) a slower curing hydrosilylation-curable silicone composition different than said hydrosilylation-curable silicone composition (I) of said first layer, said slower curing hydrosilylation-curable silicone composition (II) comprising
      (A) an organopolysiloxane having at least two alkenyl groups per molecule,
      (B) a filler,
      (C) an organopolysiloxane having at least two silicon-bonded hydrogen atoms per molecule, (D) an adhesion promoter, and
(E) a hydrosilylation catalyst; and
wherein at least one of said hydrosilylation-curable silicone compositions (I) and (II) further comprises (F) a curing inhibitor; and
wherein said slower curing hydrosilylation-curable silicone composition (II) of said second layer has a curing time at least five times greater than said hydrosilylation-curable silicone composition (I) of said first layer based on the 90% vulcanizing times of said first and second layers at 130° C. as specified by JIS K 6300.

2. The silicone-based adhesive sheet of claim 1, wherein either of said hydrosilylation-curable silicone compositions (I) and (II) has a plasticity number of from 100 to 800 as specified by JIS K 6249.

3. The silicone-based adhesive sheet of claim 1, further comprising a protective film disposed on at least one side of said silicone-based adhesive sheet and in contact with at least one of said first and second layers.

4. The silicone-based adhesive sheet of claim 1, wherein at least one of said first and second layers is cured.

5. A silicone-based adhesive sheet as set forth in claim 1 wherein both of said layers include said curing inhibitor (F), and said curing inhibitor (F) of said hydrosilylation-curable silicone composition (I) of said first layer is present in an amount different than an amount of said curing inhibitor (F) present in said slower curing hydrosilylation-curable silicone composition (II) of said second layer.

6. A silicone-based adhesive sheet as set forth in claim 1 wherein both of said layers include said curing inhibitor (F), and said curing inhibitor (F) of said hydrosilylation-curable silicone composition (I) of said first layer is of a different type than said curing inhibitor (F) of said slower curing hydrosilylation-curable silicone composition (II) of said second layer, for adjusting curing speed of said layers.

7. A silicone-based adhesive sheet as set forth in claim 1 wherein said slower curing hydrosilylation-curable silicone composition (II) of said second layer has a curing time at least 10 times greater than said hydrosilylation-curable silicone composition (I) of said first layer based on the 90% vulcanizing times of said first and second layers at 130° C. as specified by JIS K 6300.

8. A method of bonding a semiconductor chip to a chip attachment component, said method comprising the steps of:
(1) producing the semiconductor chip by dicing a laminated body comprising
a cured silicone layer bonded to a wafer and formed by curing a first layer,
a layer of curable silicone composition adjacent and firmly bonded to the cured silicone layer,
a protective film firmly bonded to the layer of curable silicone composition, and
a sheet adhesively attached to the protective film; wherein
the first layer comprises
(I) a hydrosilylation-curable silicone composition comprising
(A) an organopolysiloxane having at least two alkenyl groups per molecule,
(B) a filler,
(C) an organopolysiloxane having at least two silicon-bonded hydrogen atoms per molecule,
(D) an adhesion promoter, and
(E) a hydrosilylation catalyst;
the layer of curable silicone composition comprises
(II) a slower curing hydrosilylation-curable silicone composition different than the hydrosilylation-curable silicone composition (I) of the first layer, the slower curing hydrosilylation-curable silicone composition (II) comprising
(A) an organopolysiloxane having at least two alkenyl groups per molecule,
(B) a filler,
(C) an organopolysiloxane having at least two silicon-bonded hydrogen atoms per molecule,
(D) an adhesion promoter, and
(E) a hydrosilylation catalyst; and
wherein at least one of the hydrosilylation-curable silicone compositions (I) and (II) further comprises (F) a curing inhibitor; and
wherein the slower curing hydrosilylation-curable silicone composition (II) of the layer of curable silicone composition has a curing time at least five times greater than the hydrosilylation-curable silicone composition (I) of the first layer based on the 90% vulcanizing times of the first layer and the layer of curable silicone composition at 130° C. as specified by JIS K6300;
(2) peeling the protective film and the sheet from the semiconductor chip;
(3) bonding the semiconductor chip to the chip attachment component by pressing the semiconductor chip to the chip attachment component via the layer of curable silicone composition; and
(4) curing the layer of curable silicone composition.

9. The method of claim 8, wherein the cured silicone layer and the layer of curable silicone composition firmly bonded to the cured silicone layer are formed by
applying the first layer of the hydrosilylation-curable silicone composition (I) to the wafer,
applying a second layer of the slower curing hydrosilylation-curable silicone composition (II) to the first layer, the second layer endowed with a lower curing rate than the first layer, and
curing the first layer to form the cured silicone layer, such that the second layer of the slower curing hydrosilylation-curable silicone composition (II) is prevented from being cured.

10. The method of claim 9, wherein either of the hydrosilylation-curable silicone compositions (I) and (II) has a plasticity number of from 100 to 800 as specified by JIS K 6249.

11. A semiconductor device prepared by the method of claim 8.

12. A method of fabricating a semiconductor device comprising a semiconductor chip, a silicone-based adhesive sheet, and a semiconductor chip attachment component, said method comprising the steps of:
a) fabricating the silicone-based adhesive sheet comprising a first layer and a second layer disposed adjacent to and in contact with the first layer; wherein the first layer comprises
(I) a hydrosilylation-curable silicone composition comprising
(A) an organopolysiloxane having at least two alkenyl groups per molecule,
(B) a filler,
(C) an organopolysiloxane having at least two silicon-bonded hydrogen atoms per molecule,
(D) an adhesion promoter, and
(E) a hydrosilylation catalyst;
the second layer comprises
(II) a slower curing hydrosilylation-curable silicone composition different than the hydrosilylation-curable silicone composition (I) of the first layer, the slower curing hydrosilylation-curable silicone composition (II) comprising
- (A) an organopolysiloxane having at least two alkenyl groups per molecule,
- (B) a filler,
- (C) an organopolysiloxane having at least two silicon-bonded hydrogen atoms per molecule,
- (D) an adhesion promoter, and
- (E) a hydrosilylation catalyst; and wherein at least one of the hydrosilylation-curable silicone compositions (I) and (II) further comprises (F) a curing inhibitor; and wherein the slower curing hydrosilylation-curable silicone composition (II) of the second layer has a curing time at least five times greater than the hydrosilylation-curable silicone composition (I) of the first layer based on the 90% vulcanizing times of the first and second layers at 130° C. as specified by JIS K 6300; and b) curing the first layer of the hydrosilylation-curable silicone composition (I) so that the second layer of the slower curing hydrosilylation-curable silicone composition (II) remains uncured while the first layer of the hydrosilylation-curable silicone composition (I) is kept in contact with the semiconductor chip, and the second layer of the slower curing hydrosilylation-curable silicone composition (II) is subsequently cured while kept in contact with the semiconductor chip attachment component.

13. The method of claim 12, wherein either of the hydrosilylation-curable silicone compositions (I) and (II) has a plasticity number of from 100 to 800 as specified by JIS K 6249.

14. A semiconductor device prepared by the method of claim 12.

15. A method of fabricating a semiconductor device comprising a semiconductor chip, a silicone-based adhesive sheet, and a semiconductor chip attachment component, wherein said method comprises:
- a) fabricating the silicone-based adhesive sheet comprising a first layer and a second layer disposed adjacent to and in contact with the first layer; wherein the first layer comprises
  - (I) a hydrosilylation-curable silicone composition comprising
    - (A) an organopolysiloxane having at least two alkenyl groups per molecule,
    - (B) a filler,
    - (C) an organopolysiloxane having at least two silicon-bonded hydrogen atoms per molecule,
    - (D) an adhesion promoter, and
    - (E) a hydrosilylation catalyst;
- the second layer comprises
  - (II) a slower curing hydrosilylation-curable silicone composition different than the hydrosilylation-curable silicone composition (I) of the first layer, the slower curing hydrosilylation-curable silicone composition (II) comprising
    - (A) an organopolysiloxane having at least two alkenyl groups per molecule,
    - (B) a filler,
    - (C) an organopolysiloxane having at least two silicon-bonded hydrogen atoms per molecule,
    - (D) an adhesion promoter, and
    - (E) a hydrosilylation catalyst; and wherein at least one of the hydrosilylation-curable silicone compositions (I) and (II) further comprises (F) a curing inhibitor; and wherein the slower curing hydrosilylation-curable silicone composition (II) of the second layer has a curing time at least five times greater than the hydrosilylation-curable silicone composition (I) of the first layer based on the 90% vulcanizing times of the first and second layers at 130° C. as specified by JIS K 6300; and b) curing the first layer of the hydrosilylation-curable silicone composition (I) so that the second layer of the slower curing hydrosilylation-curable silicone composition (II) remains uncured while the first layer of the hydrosilylation-curable silicone composition (I) is kept in contact with the semiconductor chip attachment component, and the second layer of the slower curing hydrosilylation-curable silicone composition (II) is subsequently cured while kept in contact with the semiconductor chip.

16. The method of claim 15, wherein either of the hydrosilylation-curable silicone compositions (I) and (II) has a plasticity number of from 100 to 800 as specified by JIS K 6249.

17. A semiconductor device prepared by the method of claim 15.

18. A method of fabricating a semiconductor device comprising a semiconductor chip, a silicone-based adhesive sheet, and a semiconductor chip attachment component, wherein the silicone-based adhesive sheet comprises a cured silicone layer formed by curing a first layer and further comprises a layer of curable silicone composition disposed adjacent to and in contact with the cured silicone layer; wherein the first layer of the silicone-based adhesive sheet comprises
- (I) a hydrosilylation-curable silicone composition comprising
  - (A) an organopolysiloxane having at least two alkenyl groups per molecule,
  - (B) a filler,
  - (C) an organopolysiloxane having at least two silicon-bonded hydrogen atoms per molecule,
  - (D) an adhesion promoter, and
  - (E) a hydrosilylation catalyst;
the layer of curable silicone composition of the silicone-based adhesive sheet comprises
- (II) a slower curing hydrosilylation-curable silicone composition different than the hydrosilylation-curable silicone composition (I) of the first layer, the slower curing hydrosilylation-curable silicone composition (II) comprising
  - (A) an organopolysiloxane having at least two alkenyl groups per molecule,
  - (B) a filler,
  - (C) an organopolysiloxane having at least two silicon-bonded hydrogen atoms per molecule,
  - (D) an adhesion promoter, and
  - (E) a hydrosilylation catalyst; and wherein at least one of the hydrosilylation-curable silicone compositions (I) and (II) further comprises (F) a curing inhibitor; and wherein the slower curing hydrosilylation-curable silicone composition (II) of the layer of curable silicone composition has a curing time at least five times greater than the hydrosilylation-curable silicone composition (I) of the first layer based on the 90% vulcanizing times of the first layer and the layer of curable silicone composition at 130° C. as specified by JIS K 6300 said method comprising the steps of:
- a) bonding the cured silicone layer so that the layer of curable silicone composition remains uncured while the cured silicone layer is kept in contact with the semiconductor chip, and subsequently b) curing the layer of curable silicone composition while the layer of curable silicone composition is kept in contact with the semiconductor chip attachment component.

19. The method of claim 18, wherein the curable silicone composition has a plasticity number of from 100 to 800 as specified by JIS K 6249.

20. A semiconductor device prepared by the method of claim 18.

21. A method of fabricating a semiconductor device comprising a semiconductor chip, a silicone-based adhesive sheet, and a semiconductor chip attachment component, wherein the silicone-based adhesive sheet comprises a cured silicone layer formed by curing a first layer and further comprises a layer of curable silicone composition disposed adjacent to and in contact with the cured silicone layer; wherein the first layer of the silicone-based adhesive sheet comprises
- (I) a hydrosilylation-curable silicone composition comprising
  - (A) an organopolysiloxane having at least two alkenyl groups per molecule,
  - (B) a filler,
  - (C) an organopolysiloxane having at least two silicon-bonded hydrogen atoms per molecule,
  - (D) an adhesion promoter, and
  - (E) a hydrosilylation catalyst;

the layer of curable silicone composition of the silicone-based adhesive sheet comprises
- (II) a slower curing hydrosilylation-curable silicone composition different than the hydrosilylation-curable silicone composition (I) of the cured silicone layer, the slower curing hydrosilylation-curable silicone composition (II) comprising
  - (A) an organopolysiloxane having at least two alkenyl groups per molecule,
  - (B) a filler,
  - (C) an organopolysiloxane having at least two silicon-bonded hydrogen atoms per molecule,
  - (D) an adhesion promoter, and
  - (E) a hydrosilylation catalyst; and wherein at least one of the hydrosilylation-curable silicone compositions (I) and (II) further comprises (F) a curing inhibitor; and wherein the slower curing hydrosilylation-curable silicone composition (II) of the layer of curable silicone composition has a curing time at least five times greater than the hydrosilylation-curable silicone composition (I) of the first layer based on the 90% vulcanizing times of the first layer and the layer of curable silicone composition at 130° C. as specified by JIS K 6300; said method comprising the steps of:
  a) bonding the cured silicone layer so that the layer of curable silicone composition remains uncured while the cured silicone layer is kept in contact with the semiconductor chip attachment component, and subsequently
  b) curing the layer of curable silicone composition while the layer of curable silicone composition is kept in contact with the semiconductor chip.

22. The method of claim 21, wherein the curable silicone composition has a plasticity number of from 100 to 800 as specified by JIS K 6249.

23. A semiconductor device prepared by the method of claim 21.

* * * * *